United States Patent [19]
Ohshima et al.

[11] Patent Number: 5,062,109
[45] Date of Patent: Oct. 29, 1991

[54] MEMORY TESTER

[75] Inventors: Hiromi Ohshima, Saitama; Junji Nishiura, Gyoda, both of Japan

[73] Assignee: Advantest Corporation, Tokyo, Japan

[21] Appl. No.: 398,449

[22] Filed: Aug. 25, 1989

[30] Foreign Application Priority Data

Sep. 2, 1988 [JP] Japan .................................. 63-220830
Sep. 2, 1988 [JP] Japan .................................. 63-220831

[51] Int. Cl.$^5$ ............................................. G01R 31/28
[52] U.S. Cl. .................................... 371/21.2; 371/21.1
[58] Field of Search ...................... 371/21.1, 21.2, 21.3

[56] References Cited

U.S. PATENT DOCUMENTS

4,414,665 11/1983 Kimura et al. ...................... 371/21.2
4,672,583 6/1987 Nakaizumi .......................... 371/21.2
4,783,785 11/1988 Hanta ................................. 371/21.2
4,788,684 11/1988 Kawaguchi et al. ............... 371/21.2

Primary Examiner—Charles E. Atkinson
Attorney, Agent, or Firm—Staas & Halsey

[57] ABSTRACT

In a memory tester in which data read out of an address of a memory under test, specified by a pattern generator, is compared with an expected value and the result of comparison is written into a failure analysis memory at the address corresponding to that of the memory under test from which the data was read out, the output address of an address pointer which is incremented or decremented upon each application of a clock and the address from the pattern generator are selectively applied to the failure analysis memory. In the case of testing a memory which has an internal address generating function, the address from the address pointer is provided to the failure analysis memory. A cycle delay circuit is provided by which the address to be provided from the pattern generator to the failure analysis memory is delayed by a desired number of cycles in synchronism with the clock, and the address to be applied to the failure analysis memory is delayed by the same number of cycles as that for which the data read out of the memory under test is delayed.

10 Claims, 5 Drawing Sheets

MEMORY TESTER

BACKGROUND OF THE INVENTION

The present invention relates to a memory tester for testing semiconductor-integrated memories.

Figure 1:
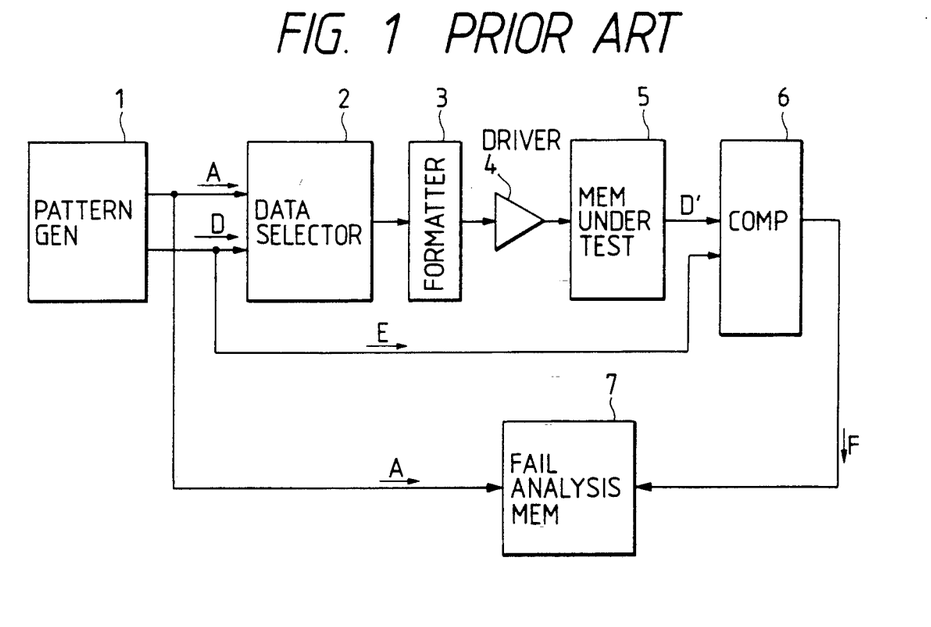
FIG. 1 is a block diagram for explaining a conventional memory tester.

FIG. 1 shows the construction of a conventional memory tester, which comprises a pattern generator 1, a programmable data selector 2, for selecting pins of a memory under test 5 to be supplied with test patterns a formatter 3, drivers 4 for,/applying a pattern signal and an address signal to the memory under test 5, a comparator 6 for making comparison between data read out of the memory under test 5 and an expected value derived from the pattern generator 1, and a failure analysis memory 7 which responds to the detection of non-coincidence by the comparator 6 to store a "1" in the same address as that supplied to the memory under test 5 to thereby store a defective address of the memory 5.

Usually, an operator predetermines data patterns and address patterns to be generated by the pattern generator 1 in accordance with the kind of memory to be tested, prepares a program for generating such patterns and sets it in the pattern generator 1. The memory under test 5 is accessed by an address signal A from the pattern generator 1, a data pattern signal D is written into the accessed address, and data D' read out therefrom is compared with an expected value E by the comparator 6. When non-coincidence is detected between the read-out data D' and the expected value E, a "1" indicating a failure is written into the same address of the failure analysis memory 7 as the address from which the data D' was read out.

Some of memories now in use are of the type that are supplied with a clock from the outside and create an address signal, such as a FIFO (First-In First-Out) memory and a SAM (Serial Access Memory) in a dual port memory.

Also in testing such a memory, it is necessary in the prior art to prepare a program for causing the pattern generator 1 to generate the same address signal as that created in the memory under test, and the address signal produced by the pattern generator 1 is provided to the failure analysis memory 7 to store therein failure analysis data.

Another type of memory is one that is commonly referred to as STRAM (Self-Timed RAM), and this provides read-out data several cycles behind the input of an address signal.

Figure 2:
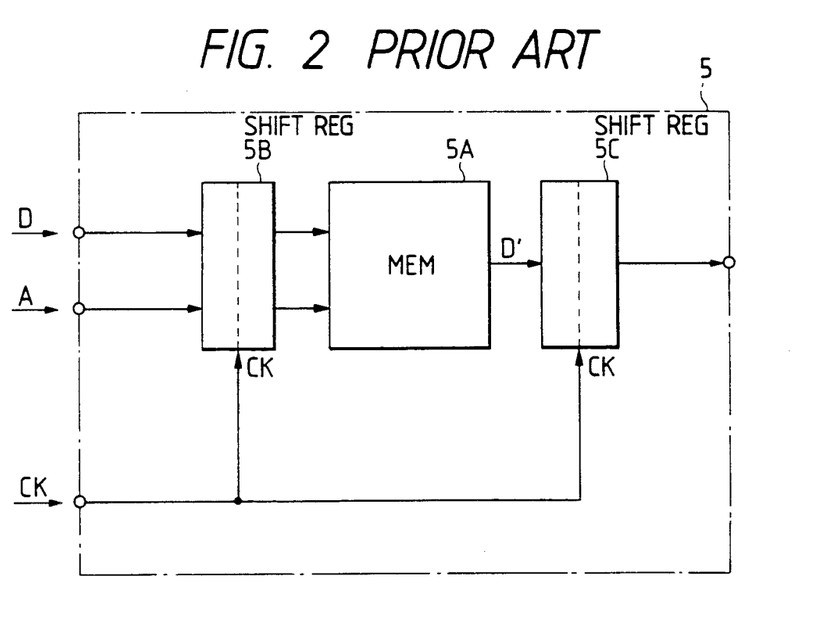
FIG. 2 is a block diagram for explaining a memory structure in which its read-out data is delayed.

This memory has pipeline registers 5B and 5C at both input and output sides of a memory 5A as shown in FIG. 2, for instance. Input data pattern D and address pattern A pass through respective stages of the pipeline register 5A in synchronism with a clock signal CK and are applied to the memory 5A, and data D' read out therefrom is output via respective stages of the pipeline register 5C in synchronism with the clock signal CK. Consequently, the data D' is delayed for cycles of the same number as the sum of the numbers of stages of the pipeline registers 5B and 5C with respect to the input read address A.

Figure 3A:
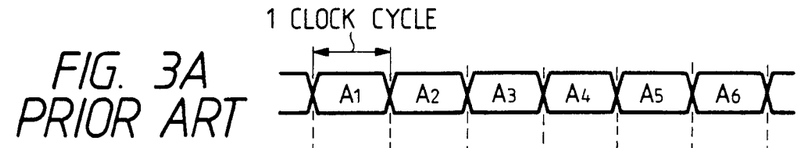
FIGS. 3A through 3C are waveform diagrams for explaining the defects of the prior art.
Figure 3B:
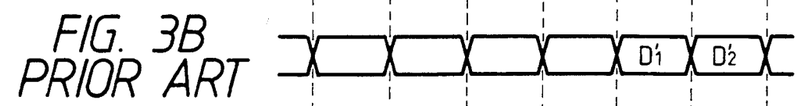

Assume that each of the pipeline registers 5B and 5C has two stages. When applying address signals $A_1$, $A_2$, $A_3$, $A_4$, . . . to the memory under test 5 as depicted in FIG. 3A, its read-out data $D_1'$, $D_2'$, $D_3'$, $D_4'$ . . . are each delivered four test cycles (i.e. four clock cycles) behind the corresponding address signal as shown in FIG. 3B.

Figure 3C:
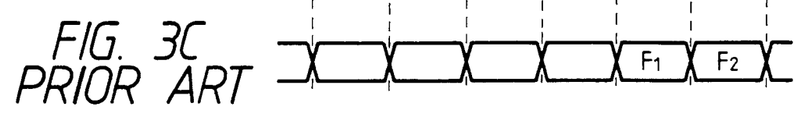

In this instance, if the result of comparison $F_1$ shown in FIG. 3C is written into the failure analysis memory 7 four test cycles behind the corresponding address signal, then the failure analysis memory 7 is accessed at an address $A_5$, wherein the result of comparison $F_1$ of the data $D_1$ read out from the address $A_1$ of the memory under test 5 will be stored. Accordingly, in the test of such a memory it is necessary to make the failure analysis bearing in mind the correct correspondence between addresses of the failure analysis memory and addresses of the memory under test. In practice, however, this is very cumbersome. Further, it is very likely to misunderstand that addresses of the failure analysis memory and the memory under test have a direct one-to-one correspondence.

SUMMARY OF THE INVENTION

It is a general object of the present invention to provide a memory tester which permits testing of various kinds of memories.

A particular object of the present invention is to provide a memory tester in which when the memory under test does not require an external address signal, an address signal need not be produced by the pattern generator, and consequently, a program need not be set for generating an address pattern.

Another object of the present invention is to provide a memory tester by which a memory of the type providing its read-out data several cycles behind the input timing of an address can also be tested while keeping its addresses in agreement with those of the failure analysis memory.

According to an aspect of the present invention, a memory tester having a failure analysis memory is provided with an address pointer which has a function of taking thereinto, as initial data, an address signal from a pattern generator, a function of incrementing or decrementing the initial address upon each application of a clock, and a function of holding a desired one of a sequence of addresses, and a selector which selectively applies either one of an address signal available from the address pointer and an address signal from the pattern generator to the failure analysis memory.

According to the present invention, where no address signal is needed for testing a memory, the selector provides the address signal from the address pointer to the memory under test. The address pointer is initialized by the same initial address as that provided to the memory under test. Then the address pointer is supplied with the same clock as that applied to the memory under test, and upon each application of this clock, the initial address of the address pointer is decremented or incremented by one, and the resulting address signal is provided via the selector to the failure analysis memory.

Consequently, the failure analysis memory is accessed at the same address as an internal address at which the memory under test is accessed. When an address of a defective cell is detected, a "1" representing the failure can be written into the corresponding address of the failure analysis memory.

With such an arrangement, an address signal need not be generated by the pattern generator in testing the memory having the internal address generating function, since the address pointer creates the same address as that produced in the memory under test. This eliminates the necessity of setting a program for operating the pattern generator to produce an address pattern, and hence affords substantial reduction of work for programming.

According to another aspect of the present invention, a memory tester which has a failure analysis memory is provided with a cycle delay circuit in an address signal supply line to the failure analysis memory for delaying an address signal for a desired number of cycles so that data read out of a memory under test and the address signal to the failure analysis memory can be delayed for the same number of cycles.

With such an arrangement, since the cycle delay circuit is provided in the address signal supply line to the failure analysis memory, the result of comparison of the data read out of the memory under test with an expected value can be written into the failure analysis memory corresponding to the address from which the data read out, by selecting the number of delay cycles of the cycle delay circuit to be equal to the number of delay cycles of the data read out of the memory under test.

DESCRIPTION OF THE PREFERRED EMBODIMENTS

Figure 4:
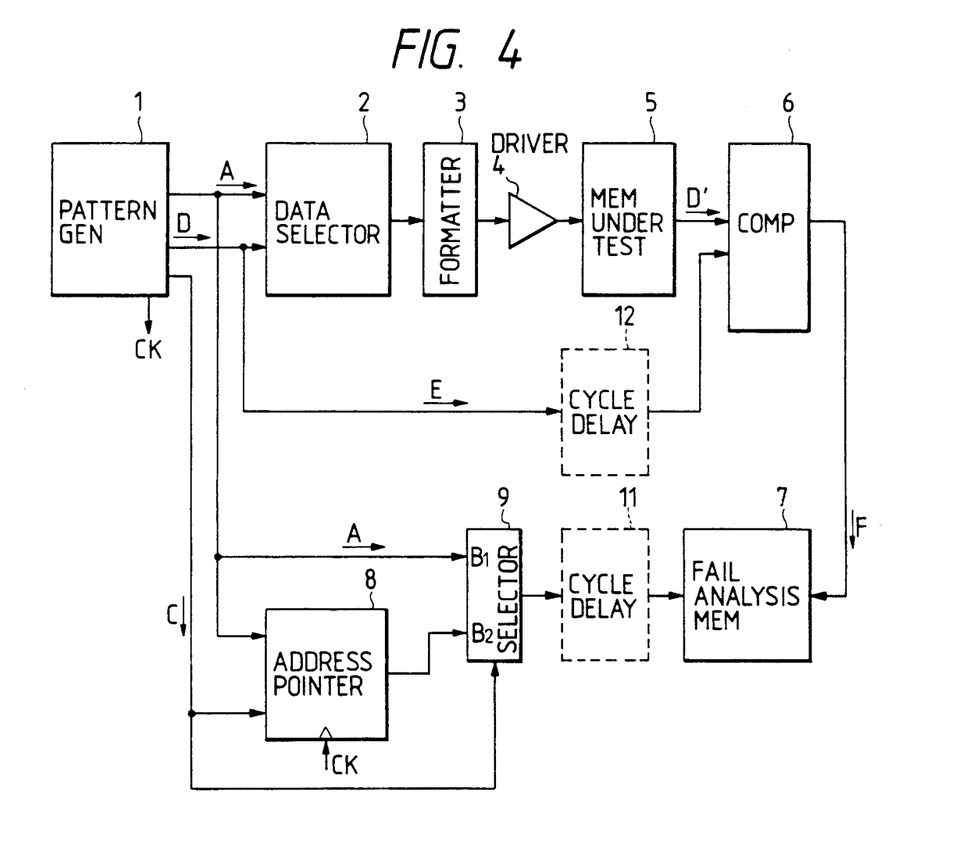
FIG. 4 is a block diagram illustrating an embodiment of the present invention.

FIG. 4 illustrates in block form an embodiment of the present invention, in which the parts corresponding to those in FIG. 1 are identified by the same reference numerals. In this embodiment an address pointer 8 and a selector 9 are provided in association with the failure analysis memory 7.

The address pointer 8 can be formed by, for example, a presettable up-down counter capable of loading an initial address value. The address pointer 8 is supplied with an address signal A from the pattern generator 1 via an address bus and a control signal C from the pattern generator 1 via a control line.

The control signal C sets the address pointer 8 into the same condition as that of an address generating section of the memory under test 5. That is, the control signal C applied to the address pointer 8 defines whether to increment or decrement the set address by one in synchronism with the input of the clock CK, or holds the set address. Further, a load command signal in the control signal C initializes the same address A as that of the memory under test 5.

The selector 9 is switched, by the control signal C from the pattern generator 1, between a state of selecting the address signal A which is applied to an input terminal B₁ from the pattern generator 1 and a to an input terminal b₂ from the address pointer 8.

In the case of testing an ordinary memory, the selector 9 selects the input terminal $B_1$, supplying the failure analysis memory 7 with the address signal A which is provided from the pattern generator 1. Where the memory under test 5 is a memory which does not require the supply of the address signal, the selector 9 is switched to the input terminal $B_2$, through which the address signal from the address pointer 8 is applied to the failure analysis memory 7. By this, the failure analysis memory 7 is accessed at the same address as that of the memory under test 5 being accessed, and when noncoincidence is detected by the comparator 6 between data read out of the memory under test 5 and the expected value, a "1" representing a failure can be written into the failure analysis memory 7 at the same address as that in which the failure has occurred.

It is also possible, in this instance, to hold a desired address by stopping the supply of the clock.

As will be seen from the above, this embodiment does not necessitate the generation of an address signal by the pattern generator 1 for accessing the failure analysis memory 7 in the case of testing a memory which does not need the address signal. This permits simplification of a program for operating the pattern generator 1, and hence facilitates the preparation of the program.

Figure 5:
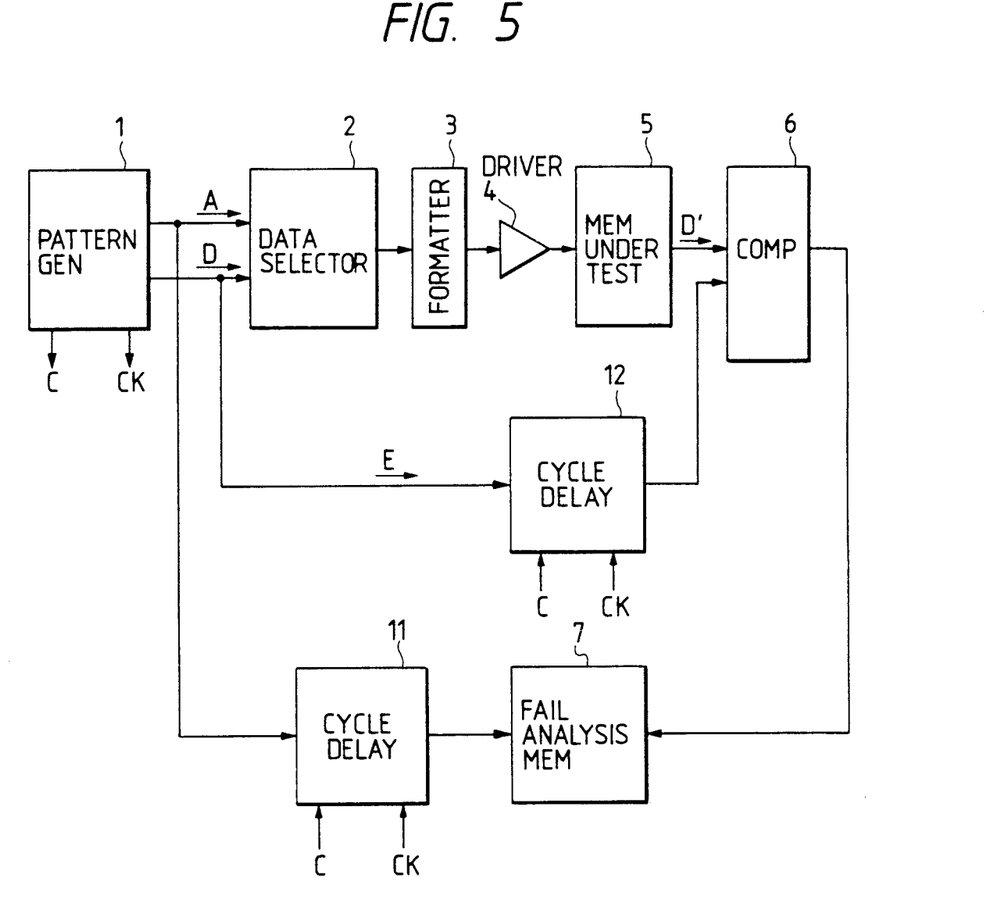
FIG. 5 is a block diagram illustrating another embodiment of the present invention.

FIG. 5 illustrates another embodiment of the present invention, in which the parts corresponding to those in FIG. 1 are indicated by the same reference numerals. This embodiment has its feature in that a cycle delay circuit 11 is provided in an address signal supply line to the failure analysis memory 7. Incidentally, this embodiment is shown to include another cycle delay circuit 12 which is provided in an expected value supply line to the comparator 6.

Figure 6:
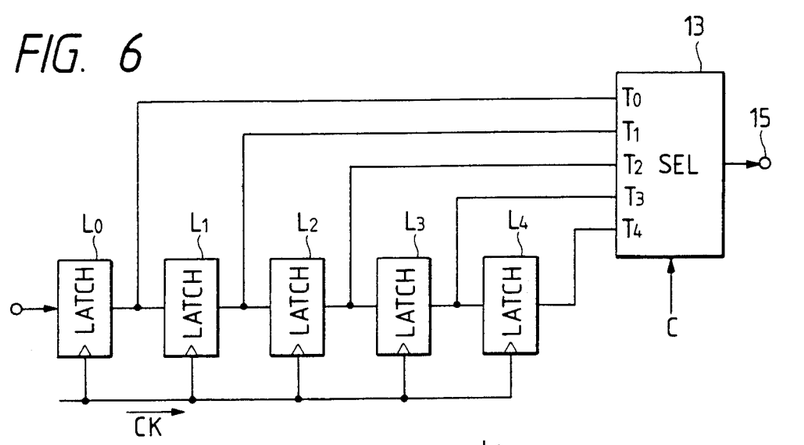
FIG. 6 is a block diagram showing an example of a cycle delay circuit for use in the present invention.

The cycle delay circuits 11 and 12 can each be made up of cascade-connected latches $L_O$ to $L_4$, each of which performs its latch operation on the clock signal CK, and a selector 13 which selectively outputs any one of their outputs, as depicted in FIG. 6, for example. The number of latches $L_O$ to $L_4$ is selected equal to or greater than a maximum number of delay cycles +1 which various memories supposed to be tested have.

The number of delay cycles of each of the cycle delay circuits 11 and 12 is selected, prior to the start of each test, by selecting any one of input terminals $T_O$ to $T_4$ of the selector 13 by the control signal C in accordance with the number of delay cycles of the memory under test 5. That is, the number of delay cycles of each cycle delay circuit is set to a value equal to the number of cycles from the time point of application of the address signal A to the memory under test 5 to the time point of obtaining the read-out data D'. This number of delay cycles is equal to the sum of the numbers of stages of the pipeline registers 5B and 5C shown in FIG. 2 and it is a delay of four clock cycles in this embodiment. Accordingly, the selector 13 is supplied with the control signal C which selectively connects its input terminal $T_4$ to an output terminal 15.

Figure 7:
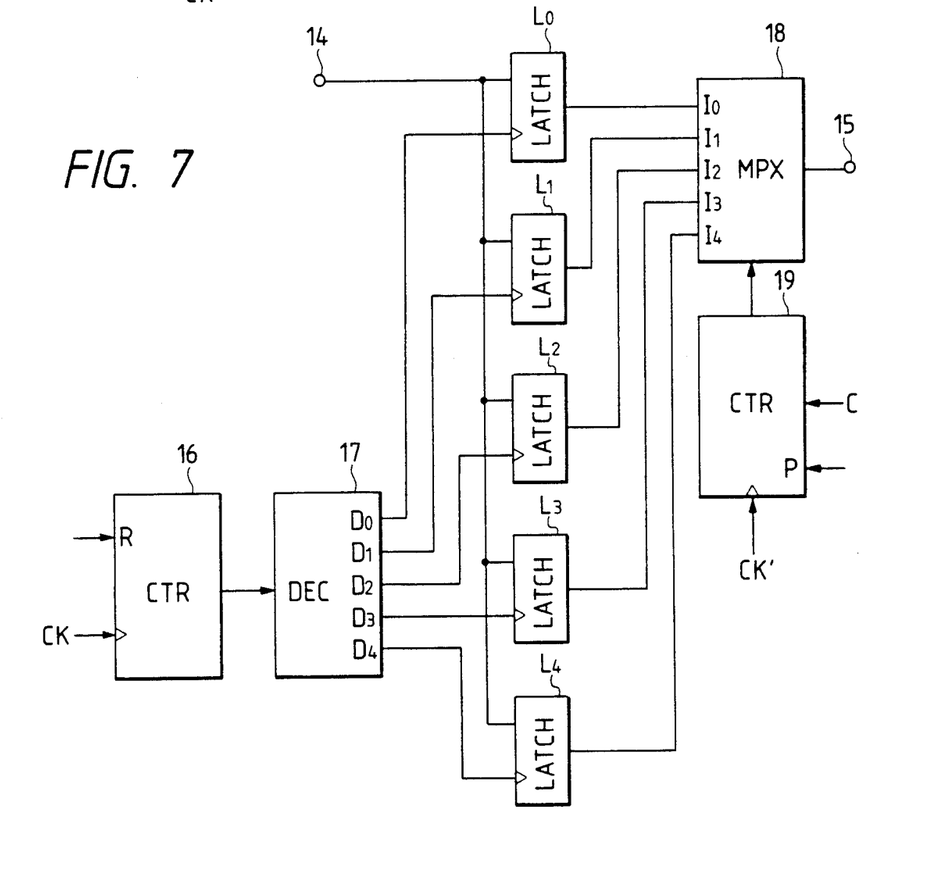
FIG. 7 is a block diagram showing another example of the cycle delay circuit.

FIG. 7 shows another example of each of the cycle delay circuits 11 and 12. A counter 16 is a quinary counter which overflows every five counts of the clock signal CK, and the count value of the counter 16 is decoded by a decoder 17, providing a "1" at the corresponding one of its output terminals $O_O$ to $O_4$. As a result of this, the decoder 17 repeats providing a "1" to its output terminals $O_O$ to $O_4$ one after another when the clock signals CK are sequentially applied to the counter 16. Accordingly, the latches $L_O$ through $L_4$ latch, in a repeating cyclic order, the address signal or expected value which is applied to a terminal 14. The outputs of the latches $L_0$ through $L_4$ are provided to a multiplexer 18. A counter 19 is a presettable quinary counter which overflows every five counts of a clock signal CK' which has the same period as the clock signal CK but slightly lags it in phase. The count value of the counter 19 is applied to the multiplexer 18, causing it to provide to an output terminal 15 the corresponding one of signals applied to its input terminals $I_0$ through $I_4$. In consequence, upon each application of the clock signal CK' to the counter 19, the signals applied to the input terminals $I_0$ through $I_4$ of the multiplexer 18 are output one by one in a repeating cyclic order. By presetting a value C corresponding to the required number of delay cycles in the counter 19 and by resetting the counter 16, the input signals which are sequentially latched in the latches $L_0$ through $L_4$ and the signals which are sequentially output from the latches L through $L_4$ via the multiplexer 18 can always be held to retain the relationship of the present number of delay cycles. The counter 16 may also be a presettable counter.

With such an arrangement as described above, the address signal A and the expected value data E which are provided to the failure analysis memory 7 and the comparator 6, respectively, are delayed by the number of cycles equal to the number of cycles for which the read-out data D' of the memory under test 5 is delayed; so that the read-out data D' is compared by the comparator 6 with the correct expected value to be compared at the corresponding address, and the result of comparison is provided to the failure analysis memory 7. At this time, the same address signal as that applied to the memory under test 5, which was delayed by the cycle delay circuit 11, is provided to an address terminal of the failure analysis memory 7. Thus, failure analysis data can be written in the failure analysis memory 7 at the same address as that of the memory under test 5 from which the data D' was read out.

Figure 8A:
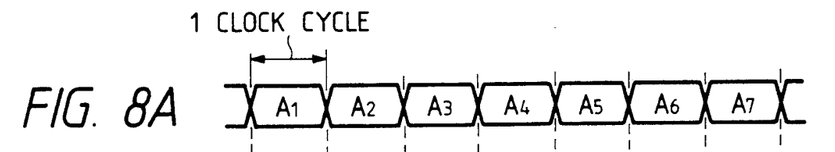
FIG. 8A through 8D are waveform diagrams for explaining the operation of the present invention.
Figure 8B:
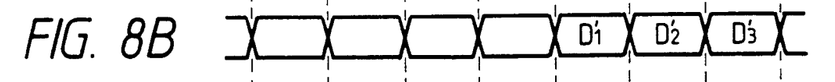
Figure 8C:
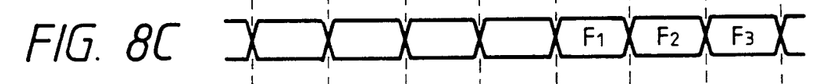
Figure 8D:
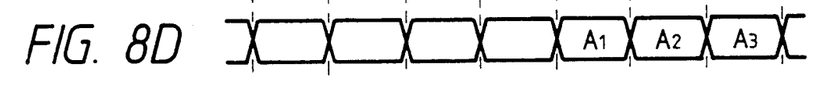

FIG. 8A shows address signals $A_1, A_2, \ldots$ applied to the memory under test 5 and FIG. 8B data $D_1', D_2', \ldots$ read out of the memory under test 5. That is, the read-out data $D_1'$ is data read out of the address $A_1$ and the read-out data $D_2'$ is data read out of the address $A_2$. In the illustrated example the read-out data $D_1', D_2', \ldots$ are output four clock cycles behind the applied addresses $A_1, A_2, \ldots$, respectively. FIG. 8C shows comparison results $F_1, F_2, \ldots$ which are outputs of the comparator 6, and FIG. 8D are delayed address signals $A_1, A_2, \ldots$ which are applied to the failure analysis memory 7.

As depicted in FIGS. 8A through 8D, the result of comparison $F_1$ of the data $D_1'$ read out of the address $A_1$ of the memory 5 is written into the failure analysis memory 7 at the same address $A_1$, and similarly, the results of comparison $F_2, F_3, F_4, \ldots$ of the data $D_2', D_3', D_4', \ldots$ read out of the addresses $A_2, A_3, A_4, \ldots$ of the memory 5 are written into the failure analysis memory 7 at the same addresses $A_2, A_3, A_4, \ldots$ As in the embodiment of FIG. 5, the cycle delay circuits 11 and 12 may also be provided in the embodiment of FIG. 4 as indicated by the broken lines therein.

According to this embodiment, the number of delay cycles of each of the cycle delay circuits 11 and 12 can be set to a value equal to the number of cycles for which data read out of the memory under test 5 is delayed. Accordingly, even if the read-out data of the memory 5 is delayed over a desired number of cycles, the delayed read-out data is compared with the correct expected value data and the result of comparison is written into the failure analysis address 7 at the correct address.

Thus an address where a failure occurs can be detected accurately, and hence an accurate failure analysis can be achieved.

It will be apparent that many modifications and variations may be effected without departing from the scope of the novel concepts of the present invention.

We claim:

1. A memory tester comprising:
   pattern generating means for generating expected value data and an address pattern which are supplied to a memory under test and generating a clock signal, said memory under test reading out data;
   comparing means for comparing data read out of said memory under test and said expected data from said pattern generating means;
   a failure analysis memory for writing therein the result of the comparison from said comparing means;
   an address pointer, connected to said pattern generating means, for receiving, as an initial address, an address from said pattern generating means and for incrementing or decrementing its address from said initial address upon each application of the clock signal and for holding at a desired address; and
   a selector selectively providing either one of an address output from said address pointer and an address output from said pattern generating means to said failure analysis memory.

2. The memory tester of claim 1, wherein said address pointer is formed by a presettable up-down counter.

3. The memory tester of claim 1, further comprising first cycle delay means, connected between said selector and said failure analysis memory, for delaying the address output from said pattern generating means, and input to said failure analysis memory by a desired number of cycles in synchronism with the clock signal.

4. The memory tester of claim 3, which further comprises second cycle delay means, connected between said pattern generating means and said comparing means, for delaying the expected value data output from said pattern generating means and input to said comparing means by the same number of cycles as that by said first cycle delay means.

5. The memory tester of claim 3, wherein said first cycle delay means includes:
   a plurality of cascade-connected latches, each of which latches an input in response to the clock signal; and
   select means, supplied with the outputs of said latches, for selecting any one of said outputs as the output of said first cycle delay means.

6. The memory tester of claim 3, wherein said first cycle delay means includes:
   a plurality of latches which latch inputs one after another in a cyclic order upon each application of the clock signal; and
   cyclic output means for outputting the outputs of said latches one after another in a cyclic order upon each application of the clock signal.

7. A memory tester comprising:
   pattern generating means for generating expected value data and an address pattern which are supplied to a memory under test and generating a clock signal, said memory under test reading out data;

comparing means for comparing data read out of said memory under test and said expected value data from said pattern generating means;

a failure analysis memory, connected to said pattern generating means, for writing therein the result of the comparison from said comparing means; and first cycle delay means, inserted in series between the connection of said pattern generating means and said failure analysis memory, for delaying the address output from said pattern generating means and input to said failure analysis memory be a desired number of cycles in synchronism with the clock signal, the number of delay cycles of said data read out of said memory under test and the number of delay cycles of said address to be supplied to said failure analysis memory being made equal to each other.

8. The memory tester of claim 7, further comprising a second cycle delay means, connected between said pattern generating means and said comparing means, for delaying the expected value data output from said pattern generating means and input to said comparing means by the same number of cycles as that by said first cycle delay means.

9. The memory tester of claim 1, wherein said first cycle delay means includes:

a plurality of cascade-connected latches, each of which latches an input in response to the clock signal; and select means, supplied with the outputs of said latches, for selecting any one of said outputs as the output of said first cycle delay means.

10. The memory tester of claim 7, wherein said first cycle delay means includes:

a plurality of latches which latch inputs one after another in a cyclic order upon each application of the clock signal; and cyclic output means for outputting the outputs of said latches one after another in a cyclic order upon each application of the clock signal.

* * * * *

UNITED STATES PATENT AND TRADEMARK OFFICE
CERTIFICATE OF CORRECTION

PATENT NO. : 5,062,109
DATED : OCTOBER 29, 1991
INVENTOR(S) : HIROMI OHSHIMA ET AL.

It is certified that error appears in the above-identified patent and that said Letters Patent is hereby corrected as shown below:

Col. 1, line 9, "selecting pins" should be --selecting desired pins--.

Col. 3, line 67, "a to" should be --a state of selecting an address signal which is applied to--;
line 68, "b$_2$" should be --B$_2$--.

Col. 8, line 5, "claim 1," should be --claim 7,--.

Signed and Sealed this

Second Day of March, 1993

Attest:

STEPHEN G. KUNIN

Attesting Officer

Acting Commissioner of Patents and Trademarks